(12) United States Patent  
Mason

(10) Patent No.: US 9,337,804 B2  
(45) Date of Patent: May 10, 2016

(54) IMPEDANCE MATCHING NETWORK WITH HIGH FREQUENCY SWITCHING

(71) Applicant: Advanced Energy Industries, Inc., Fort Collins, CO (US)

(72) Inventor: Christopher C. Mason, San Jose, CA (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 0 days.

(21) Appl. No.: 14/731,624

(22) Filed: Jun. 5, 2015

(65) Prior Publication Data

US 2015/0288348 A1     Oct. 8, 2015

Related U.S. Application Data

(63) Continuation of application No. 13/830,563, filed on Mar. 14, 2013, now Pat. No. 9,065,426, which is a continuation-in-part of application No. 13/288,712, filed on Nov. 3, 2011, now Pat. No. 8,436,643.

(60) Provisional application No. 61/410,330, filed on Nov. 4, 2010.

(51) Int. Cl.

| H03H 5/00 | (2006.01) |
|---|---|
| H03H 11/28 | (2006.01) |
| H01J 37/32 | (2006.01) |
| H03H 7/40 | (2006.01) |
| H05H 1/46 | (2006.01) |
| H03K 17/56 | (2006.01) |
| H03K 17/74 | (2006.01) |

(52) U.S. Cl.
CPC .......... *H03H 11/28* (2013.01); *H01J 37/32183* (2013.01); *H03H 7/40* (2013.01); *H03K 17/56* (2013.01); *H03K 17/74* (2013.01); *H05H 2001/4682* (2013.01)

(58) Field of Classification Search
None
See application file for complete search history.

(56) References Cited

U.S. PATENT DOCUMENTS

| 3,872,325 | A | | 3/1975 | Adams et al. | |
|---|---|---|---|---|---|
| 5,054,114 | A | * | 10/1991 | Erickson | H04B 1/48 333/101 |
| 5,670,881 | A | * | 9/1997 | Arakawa | G01R 33/3628 324/322 |
| 6,677,828 | B1 | * | 1/2004 | Harnett | H01J 37/32082 315/111.21 |
| 6,887,339 | B1 | | 5/2005 | Goodman et al. | |
| 6,927,647 | B2 | | 8/2005 | Starri et al. | |

(Continued)

OTHER PUBLICATIONS

Korean Intellectual Property Office, "Korean Office Action re Application No. 10-2011-0128155", Feb. 27, 2014, p. 5, Published in: KR.

(Continued)

*Primary Examiner* — Crystal L Hammond
(74) *Attorney, Agent, or Firm* — Neugeboren O'Dowd PC

(57) ABSTRACT

An impedance matching network having a plurality of reactance elements is disclosed. Each of the plurality of switching circuits comprises a first node and a second node; a first diode having an anode coupled to the first node and a cathode coupled to the second node; a second diode having an anode to couple to the second voltage line and a cathode to couple to the first node; and a transistor having a first, second, and control terminals. Each of the plurality of reactance elements is switched into the impedance matching network when the transistor in the respective one of the plurality of switching circuits is on and switched out after the transistor in the respective one of the plurality of switching circuits is off.

16 Claims, 11 Drawing Sheets

(56) References Cited

U.S. PATENT DOCUMENTS

| | | | |
|---|---|---|---|
| 6,992,543 B2 * | 1/2006 | Luetzelschwab | H03F 1/56 |
| | | | 330/195 |
| 7,042,311 B1 | 5/2006 | Hilliker et al. | |
| 7,109,788 B2 * | 9/2006 | Jevtic | H01J 37/32183 |
| | | | 329/346 |
| 7,368,971 B2 | 5/2008 | Pengelly | |
| 7,369,096 B2 | 5/2008 | Castaneda et al. | |
| 7,675,385 B1 | 3/2010 | Mulbrook et al. | |
| 7,764,140 B2 | 7/2010 | Nagarkatti et al. | |
| 7,796,969 B2 * | 9/2010 | Kelly | H03K 17/063 |
| | | | 257/341 |
| 8,436,643 B2 * | 5/2013 | Mason | H01J 37/32183 |
| | | | 326/30 |
| 9,196,459 B2 * | 11/2015 | Bhutta | H01J 37/32183 |
| 2005/0057276 A1 * | 3/2005 | Washburn | H04L 25/0298 |
| | | | 326/30 |
| 2006/0119451 A1 | 6/2006 | Chen | |
| 2006/0194567 A1 | 8/2006 | Kelly et al. | |
| 2007/0139122 A1 | 6/2007 | Nagarkatti et al. | |
| 2000/0080238 | 10/2008 | Matsuo | |
| 2011/0148374 A1 * | 6/2011 | Gizara | H02M 3/157 |
| | | | 323/282 |

OTHER PUBLICATIONS

Hammongd, Crystal L., "Office Action re U.S. Appl. No. 13/380,563", Nov. 20, 2014, p. 6, Published in: US.

Gruber, Stephen S., "Office Action Response re U.S. Appl. No. 13/830,563", , p. 8, Published in: US.

* cited by examiner

IMPEDANCE MATCHING NETWORK WITH HIGH FREQUENCY SWITCHING

CLAIM OF PRIORITY UNDER 35 U.S.C. §120

This application is a Continuation of U.S. application Ser. No. 13/830,563 filed Mar. 14, 2013 and entitled "HIGH FREQUENCY SOLID STATE SWITCHING FOR IMPEDANCE MATCHING," which is a Continuation-in-Part of U.S. patent application Ser. No. 13/288,712 filed Nov. 3, 2011 and entitled "HIGH FREQUENCY SOLID STATE SWITCHING FOR IMPEDANCE MATCHING," now U.S. Pat. No. 8,436,643, which claims priority to U.S. Provisional Application No. 61/410,330 filed Nov. 4, 2010 and entitled "HIGH FREQUENCY SOLID STATE SWITCHING FOR IMPEDANCE MATCHING," the entire disclosures of which are hereby incorporated by reference for all proper purposes, as if fully set forth herein.

FIELD OF THE DISCLOSURE

The present invention relates generally to plasma processing. In particular, but not by way of limitation, the present invention relates to systems, methods and apparatuses for impedance-matching radio frequency power transmitted from a radio frequency generator to a plasma load in a semiconductor processing chamber.

BACKGROUND

In the semiconductor manufacturing world, manufacturers produce plasma processing chambers that utilize radio frequency (RF) power to generate a plasma. In order to achieve efficient power transfer between the RF generator ("generator") and the plasma load, an impedance-matching network ("match") is often used to match the load impedance to a desired input impedance, typically 50 ohm. Plasma load impedance may vary depending on variables such as generator frequency, power, chamber pressure, gas composition, and plasma ignition. The match accounts for these variations in load impedance by varying electrical elements, typically vacuum variable capacitors, internal to the match to maintain the desired input impedance.

Match networks typically contain reactance elements, meaning elements that store energy in electrical and magnetic fields as opposed to resistive elements that dissipate electrical power. The most common reactance elements are capacitors, inductors and coupled inductors but others such as distributed circuits are also used. Match networks can also include lossless elements including transmission lines and transformers. The only resistive elements in a match network are typically associated with losses in non-ideal reactive and lossless components or components that do not take part in the impedance transformation such as components for sensing voltage, current, power or temperature.

Match networks can comprise a number of variable reactance elements. For instance, vacuum variable capacitors can be used. However, these are bulky and expensive. In the alternative, banks of parallel capacitors having different capacitances, and being added or removed from the parallel circuit via electrical switches have also been considered. Often, such capacitor banks use high power PIN diodes (controlled by a transistor) to switch the capacitors in and out of the parallel system. However, such PIN diodes can be too slow for RF power applications, or can require excessive power to accomplish the switching at acceptable speeds. This in turn results in running the PIN diodes at high temperatures. PIN diodes are also expensive and only produced by a handful of manufacturers.

SUMMARY OF THE DISCLOSURE

Exemplary embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents and alternative constructions that fall within the spirit and scope of the invention as expressed in the claims.

Some embodiments may be characterized as an impedance matching network having a controller, a first voltage line, a second voltage line, and a plurality of reactance elements. Each of the plurality of reactance elements is coupled in parallel relative to other ones of the reactance elements, and each of the reactance elements is coupled between the first voltage line and a respective one of a plurality of switching circuits. Each of the plurality of switching circuits comprises a first node and a second node; a first diode having an anode coupled to the first node and a cathode coupled to the second node; a second diode having an anode to couple to the second voltage line and a cathode to couple to the first node; and a transistor having a first, second, and control terminals. The first terminal is coupled to the second node, the second terminal is coupled to the second voltage line, and the control terminal is coupled to the controller. The controller is configured to provide a control signal to the control terminal of each of the plurality of switching circuits to selectively switch the transistor in each respective one of the plurality of switching circuits on and off. Each of the plurality of reactance elements is switched into the impedance matching network when the transistor in the respective one of the plurality of switching circuits is on and switched out after the transistor in the respective one of the plurality of switching circuits is off.

Other embodiments may be characterized as an impedance matching network having a controller, a first voltage line, a second voltage line, and a plurality of switched-reactance elements. Each of the plurality of switched-reactance elements is coupled in parallel between the first voltage line and the second voltage line, and includes a reactance element and a switching circuit. The reactance element is coupled between the first voltage line and a first node of the switching circuit. The switching circuit includes a first diode having an anode coupled to the first node and a cathode coupled to a second node; a second diode having an anode to couple to the second voltage line and a cathode to couple to the first node; and a transistor having a first, second, and control terminals. The first terminal is coupled to the second node; the second terminal is coupled to the second voltage line; and the control terminal is coupled to the controller. Each of the plurality of reactance elements is switched between the first and second voltage lines when the transistor in the respective one of the plurality of switching circuits is on and switched out from between the first and second voltage lines after the transistor in the respective one of the plurality of switching circuits is off.

BRIEF DESCRIPTION OF THE DRAWINGS

Various objects and advantages and a more complete understanding of the present invention are apparent and more readily appreciated by referring to the following detailed description and to the appended claims when taken in conjunction with the accompanying drawings:

DETAILED DESCRIPTION

The present disclosure relates generally to plasma processing. More specifically, but without limitation, the present disclosure relates to match networks of a power supply for generating and sustaining a plasma in, or provided to, a plasma processing chamber.

Figure 1:
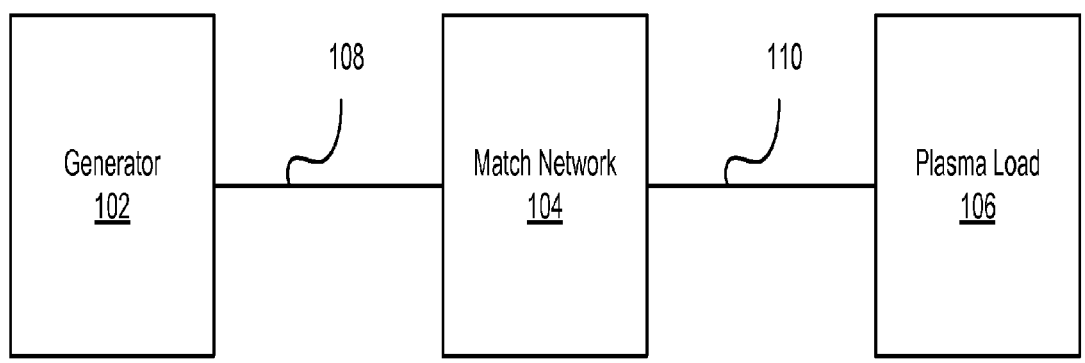
FIG. 1 is a circuit diagram of a plasma processing system according to one embodiment of this invention.

FIG. 1 is a circuit diagram of a plasma processing system according to one embodiment of this invention. A generator 102 transmits RF power to a match network 104 ("match") via a transmission line 108 (e.g., coaxial cable) and then onto a plasma load 106 via an electrical connection 110. The match network 104 varies its internal electrical elements such that the input impedance of the match network 104 is close to the desired input impedance.

Figure 2:
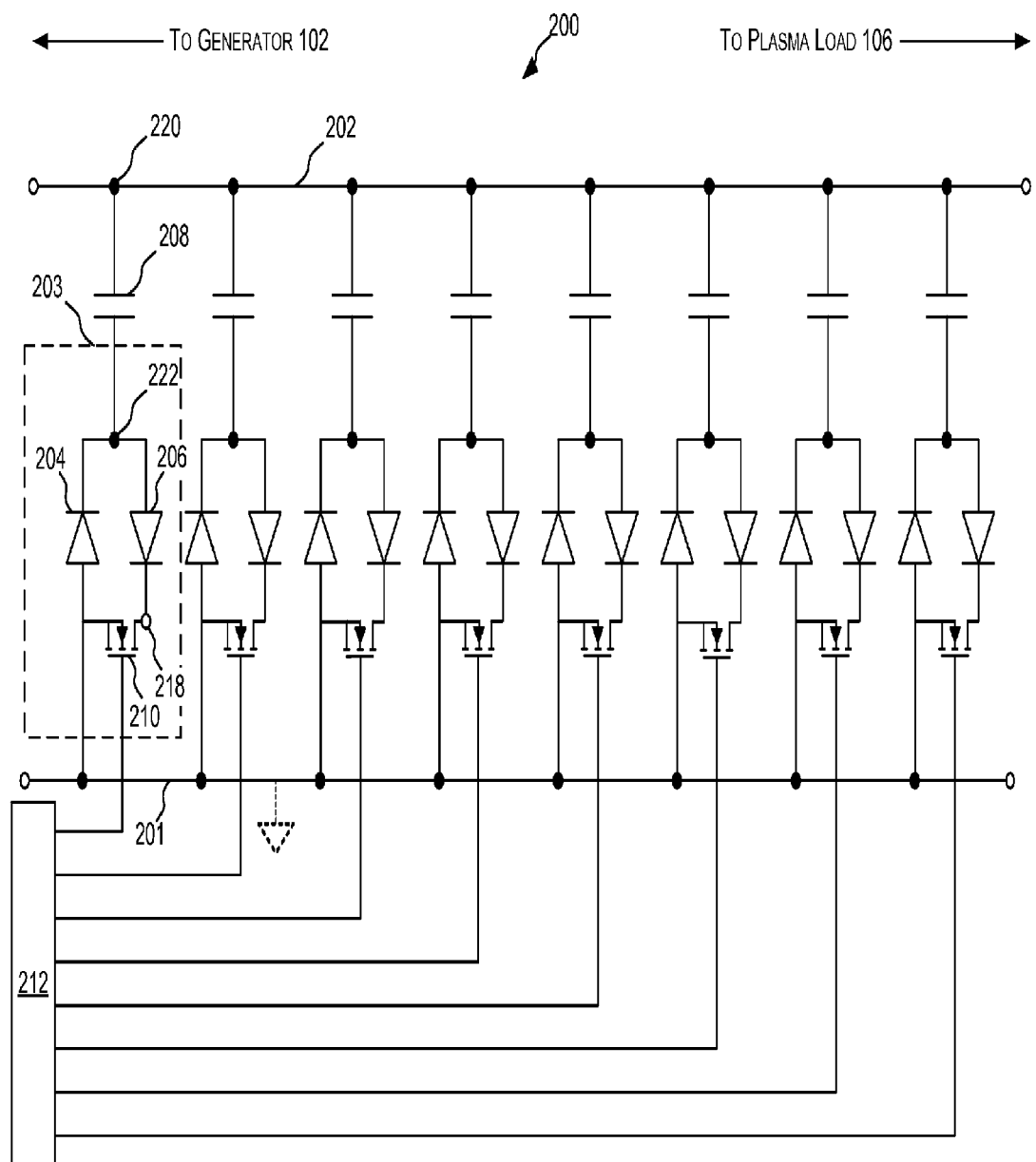
FIG. 2 illustrates a variable capacitance element according to one embodiment herein disclosed.

The match 104 can include two or more variable capacitance elements coupled in parallel. Often such variable capacitance elements can be mechanically-varied capacitors, which, as described above, are bulky, slow, and expensive. In the alternative, variable capacitive elements can be made from banks of parallel electronically switched capacitors, which are smaller, faster, and cheaper than their mechanical counterparts. While the prior art uses PIN diodes to switch capacitors in and out of the variable capacitance element, FIG. 2 illustrates an embodiment in which common and inexpensive transistors can be used to switch diodes (e.g., PN diodes) and thus switch the capacitors in and out of the variable capacitance element. Furthermore, while this circuit overcomes some downsides of PIN diodes in certain circumstances, in other cases PIN diodes, when used in this novel circuit configuration, can be preferred. For instance, while PIN diodes can be too slow for RF power applications, where lower duty cycles are acceptable, PIN diodes can be used and this novel circuit design provides advantages over prior art PIN diode circuit designs. Furthermore, while PIN diodes can require excessive power to accomplish switching at acceptable speeds, lower duty cycles can again make the use of PIN diodes and their varied benefits acceptable. Additionally, while PIN diodes are somewhat expensive and produced by a handful of manufacturers, this cost can be outweighed by the benefits of using PIN diodes in this novel circuit design as compared to prior art PIN diode circuit designs.

The variable capacitance element 200 comprises various switched capacitors 208 coupled in parallel such that the switching in and out of each of the various switched capacitors 208 alters the impedance of the variable capacitance element 200. The switched capacitors 208 each have a switching circuit 203 for switching the switched capacitors 208 in and out of the variable capacitance element 200. Each switching circuit 208 can have a pair of solid-state diodes (e.g., PN or Schottky diodes) 204, 206, one of which can be connected to a transistor 210 (e.g., MOSFET, power MOSFET, IGBT, to name a few), configured to switch the switched capacitor 208 into the variable capacitance element 200 when the transistor 210 is on (closed). This switching can be achieved without the use of any external bias of the diode 206 (although small biases may be desirable under circumstances to be discussed later).

When the transistor 210 is on, RF current passes between the first voltage line 202 and the second voltage line 201 passing in a forward biased direction through each of the diodes 204, 206 alternately. As such, when the switched capacitor 208 is switched into the variable capacitance element 200, AC (e.g., RF) current can pass between the first voltage line 202 and the second voltage line 201 and the impedance that the match 104 presents to the generator 102 changes.

When the transistor is off, positive portions of the RF signal push current through the diode 206 and charge a body capacitance of the transistor 210 until a voltage across the transistor 210, from node 218 to the second voltage line 201, is greater than a voltage between node 222 and the second voltage line 201 (in other words the voltage across diode 204). When such a voltage exists, the diode 206 is reverse biased, thus preventing substantially all current from passing through the switched capacitor 208. At this point the switching circuit 203 can be considered off and the impedance that the match 104 presents to the generator 102 is changed.

Capacitors 208 can be selected so that their capacitance increases as a power of 2 from left to right in the variable capacitance element 200. Accordingly, the capacitance can increases from left to right as squares of the capacitance of the leftmost capacitor (e.g., C*1, C*2, C*4, C*8, C*16, C*32, C*64, C*128). Therefore it is possible to vary the capacitance of the match in 256 steps by selectively driving the switching circuits 203.

The variable capacitance element 200 can include any number of switched capacitors 208, although in the illustrated embodiment, there are eight (8) switched capacitors 208. Each switched capacitor 208 is wired in parallel to a generator 102 and a plasma load 106, and between a first voltage line 202 and a second voltage line 201 assuming a floating variable capacitance element 200. In some embodiments, the second voltage line 201 can be replaced by a grounded voltage line or ground connections to each element illustrated as coupling to the second voltage line 201. The switched capacitor 208 is switched into the variable capacitance element 200 (altering the reactance of the match network) when current passes through the switched capacitor 208 either to or from the first voltage line 202. This occurs when the transistor 210 is closed (on).

Inexpensive transistors have not been used to switch switched capacitors such as 208 because they typically dissipate large amounts of heat when operated at the RF frequencies and high powers associated with plasma processing. They also tend to have transient times far greater than that of the RF signal from the generator 102, in which case the transistor are typically unable to turn off. Transient time is the time required to turn a device on or off. In other words, the amount of time between the beginning of a switching action and a point at which a higher/lower steady state voltage or current has been achieved. SiC transistors, which have negligible transient times, have been used with some success, but their expense along with distortion of the RF signal to the plasma load 106 makes them less than preferable.

Typical match networks are designed to tune and then hold the tuned impedance until the load impedance changes. Distortion occurs, when the impedance of the match continues to change after tuning is complete. Given a switched capacitor 208 that is switched out during tuning, distortion means that some current still passes through the switched capacitor 208 even though it is switched out. Given a switched capacitor 208 that is switched in during tuning, distortion means that less than a full current passes through the switched capacitor 208 even though it is switched in. For instance, if a transistor were used as the sole switching component in switching circuit 203, it would cause distortion since current would continue to pass through the switched capacitor 208 and charge and discharge a body capacitance of the transistor when it was off (the body capacitance is an inherent capacitance in transistor structures measured between the collector and ground terminal of a BJT or IGBT, or between the drain and ground of a FET). In other words, the switched capacitor 208 would never be completely switched out and hence would distort the RF signal after tuning was completed.

Furthermore, the transistor body capacitance is in series with the switched capacitor 208 and therefore affects the current swing through the switched capacitor 208 occurring during switching. Typical body capacitance of a transistor is many times (e.g., two to four orders of magnitude) greater than that of the switched capacitor 208. Thus, far more voltage drops across the switched capacitor 208 than across the body capacitance of a transistor when they are in series and the transistor is off. When the transistor is turned on, only a small increase in voltage drop across the switched capacitor 208 occurs and thus only a small change in current. Thus, the switched capacitor 208 may not be effective at changing the impedance of the variable capacitance element 200 since the current through it will only nominally change when switched. In short, were the switching circuit 203 to merely comprise a transistor, the switched capacitor 208 would not have a very appreciable effect on the impedance when switched in and out of the variable capacitance element 200.

This disclosure overcomes these deficiencies by shielding the transistor 210 (and thus its body capacitance) from the switched capacitor 208 when the transistor 210 is off and forcing RF current to only pass through the transistor 210 in one direction when it is on. To achieve these goals, an arrangement of two parallel diodes having opposite polarity are used. A first diode 206 is arranged between the switched capacitor 208 and the transistor 210, with anode coupled to a first node 222 and a cathode coupled to a second node 218, and the first diode 206 is biased such that current is largely precluded from passing from the first voltage line 202 through the first diode 206 to the transistor 210 when the transistor 210 is off (open). In other words, when the transistor 210 is off, the first diode 206 is reverse biased.

When a voltage on the first voltage line 202 swings low, the body capacitance of the transistor 210 does not discharge through the switched capacitor 208 because the first diode 206 is still reverse biased. In other words, when the transistor 210 is off, the first diode 206 is reverse biased regardless of whether the voltage on the first voltage line 202 is positive or negative. As such, current from the first voltage line 202 or from the second voltage line 201 is largely unable to pass through the transistor 210 when it is off, and the large off-state body capacitance of the transistor 210 is unseen by the switched capacitor 208.

It should be clear to one of skill in the art that the first diode 206 is reverse biased when the voltage on the first voltage line 202 swings negative. But the ability of the first diode 206 to remain reverse biased when the voltage on the first voltage line 202 swings positive is novel and unexpected. In this case, there is a short time wherein the first diode 206 can be forward biased, but during this time the body capacitance of the transistor 210 charges and the voltage between the first node 218 and second voltage line 201 rises. When this voltage ("transistor body voltage") is larger than a voltage from the second node 222 to the second voltage line 201 (minus a diode voltage drop), the first diode 206 becomes reverse biased. This can be referred to as autobiasing, since the first diode 206 is reverse biased by the voltages inherent in the switching circuit 203 rather than via an external bias supply.

Accordingly, some embodiments of this disclosure comprise a switching circuit 203 to switch a switched capacitor 208 in and out of a variable capacitance element 200, using low-cost transistors that achieve large changes in voltage across the switched capacitor 208 when the capacitor 208 is switched in and out of the variable capacitance element 200. They do so with low distortion of the RF signal on the first voltage line 202, and do so with a minimum of devices (e.g., two diodes in parallel) and no further biasing sources.

To illustrate an example of the operation of a switching circuit 203, assume the RF signal has a peak-to-peak voltage of two hundred volts (200 V), and transistor 210 is turned off. The voltage at the node 220 goes to negative one hundred volts (−100 V) in the negative half cycle of the RF signal. Second diode 204 is forward bias, so the voltage at the first node 222 is just below ground (∼−0.7 V). The First diode 206 is reverse biased. In the positive half cycle of RF signal, the second diode 204 is reverse biased. The voltage at node 220 goes from negative hundred volts (−100V) to positive hundred volts (+100V), and the voltage at the first node 222 rises toward two hundred volts (+200 V). As the voltage at the first node 222 goes positive, the first diode 206 turns on and starts to charge the body capacitance of transistor 210 because the transistor is turned off. When the voltage on the body capacitance of transistor 210 goes more positive than the voltage across the second diode 204, the first diode 206 turns off. Depending on the frequency of the RF signal, the voltage across the body capacitance of the transistor 210 will rise in one or more cycles to two hundred volts (200 V). With both diodes 204, 206 reverse biased (biased off), no current flows through switched capacitor 208, and the switched capacitor 208 is electrically removed from the variable capacitance element 200 thus altering the impedance that the match 104 presents to the generator 102.

When the transistor 210 is turned on (closed), the voltage on the body capacitance of the transistor 210 discharges, and the voltage at the first node 222 goes near to the voltage of the second voltage line 201. Now diodes 204 and 206 are holding the voltage at the first node 222 near the voltage of the second voltage line 201 throughout the entire cycle of the RF signal, and switched capacitor 208 is electrically added into the circuit of the variable capacitance element 200 thus altering the impedance that the match 104 presents to the generator 102.

It should be noted that while the transistor 210 is illustrated as an N-channel MOSFET, various other transistors can also be implemented including, but not limited to, IGBTs.

A controller 212 provides the control signal (e.g., gate signal in a FET or base signal in a BJT or IGBT) to a control terminal of the transistor 210 to control the on and off state of the transistor 210.

While discussion of FIG. 2 has focused on a bank of parallel switched capacitors 208, in other embodiments, the match network 204 can utilize any form of switched reactance elements, such as inductive elements (e.g., inductors) or combinations of inductive and capacitive elements (e.g., a capacitor in series with an inductor) or distributed elements such as transmission line sections, in order to match both real and imaginary portions of impedance.

Figure 3:
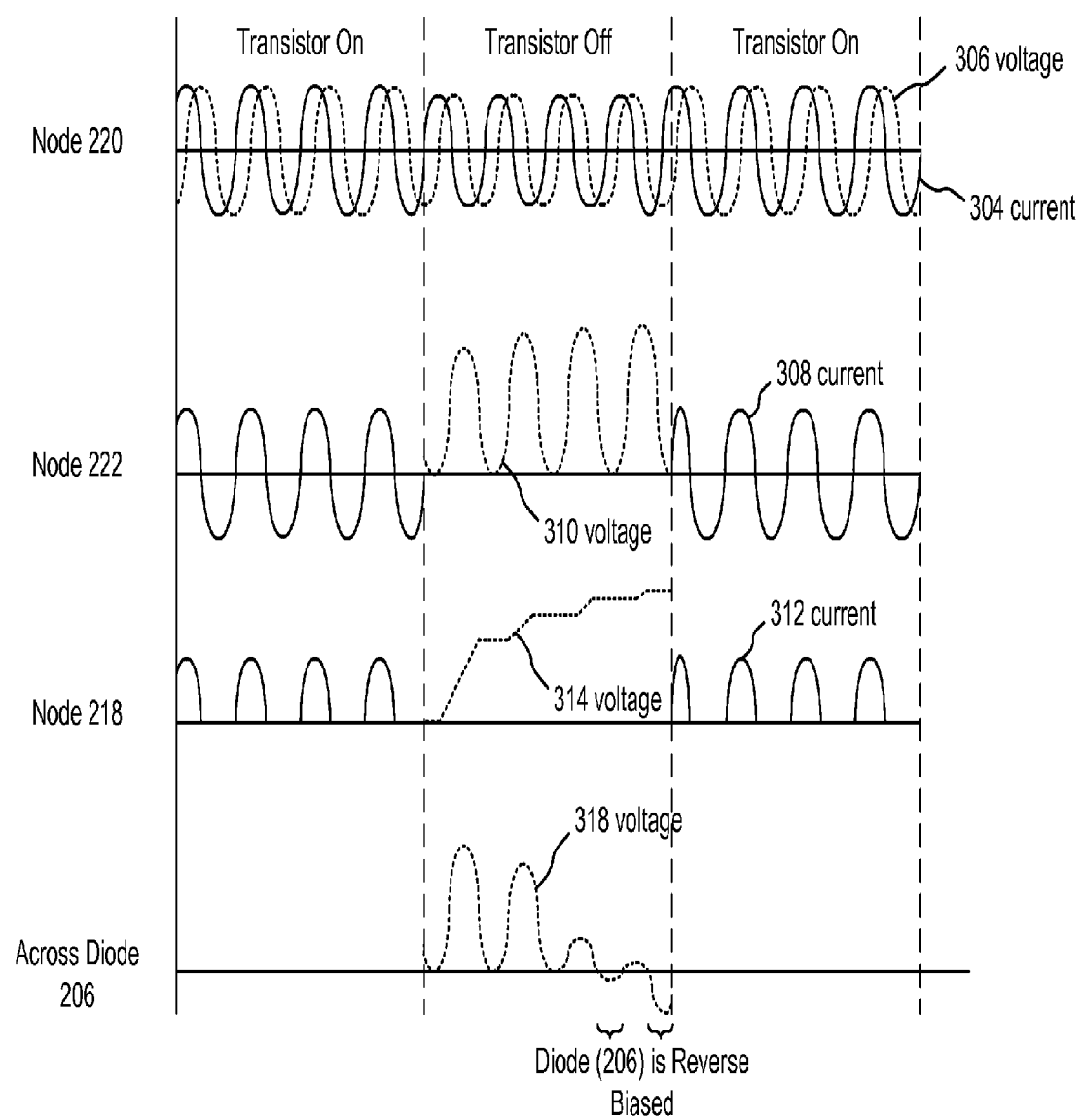
FIG. 3 illustrates voltage and current characteristics of the variable capacitance element illustrated in FIG. 2.

FIG. 3 illustrates voltage and current characteristics of the variable capacitance element 200 illustrated in FIG. 2. For these plots, a sinusoidal RF signal is illustrated as seen by the current 304 and voltage 306 measured at the node 220. The voltage 306 is measured relative to the second voltage line 201 (which is optionally grounded). While a more complex RF signal can be used in practice, these descriptions are made simpler by using a simple sinusoidal signal. When the transistor 210 is turned off, the current 304 and voltage 306 drop slightly accounting for the voltage and current that are being applied to the switched capacitor 208 and the switching circuit 203.

At the first node 222, between the switched capacitor 208 and the diodes 204, 206, current 308 at the first node 222 when the transistor 210 is on is proportional to the current 304 at the node 220. When the transistor 210 turns off the switched capacitor 208 is switched out of the variable capacitance element 200 and current 308 ceases to pass through the switched capacitor 208.

In contrast, while the transistor 210 is on, there is very little voltage drop across the diodes 204, 206, and the transistor 210, and thus the voltage 310 at the first node 222 is near zero (the voltage 310 may fluctuate around 0 V when the transistor 210 is on, but is not illustrated in FIG. 3 for simplicity). When the transistor 210 turns off, the voltage 310 at the first node 222 begins to fluctuate in phase with the voltage 306 on the first voltage line 202, but with an amplitude roughly equal to the peak-to-peak voltage 306 on the first voltage line 202. In addition, while the transistor 210 is off, some current periodically passes through the switched capacitor 208 and the first diode 206 and charges the body capacitance of the transistor 210. This effect is responsible for the gradual rise in voltage 310 seen while the transistor 210 is off. When the transistor is closed, the voltage 310 returns to near 0 V and the current 308 again resembles the current 304 on the first voltage line 202.

At the second node 218, between the first diode 206 and the transistor 210, current is the same as the current 308 at the first node 222, except that the first diode 206 rectifies the current 312 such that only positive current 312 reaches the second node 218. The voltage 314, which is the voltage across the transistor 210, is small when the transistor is on, and thus is not illustrated for simplicity. When the transistor 210 turns off, the voltage 310 at the first node 222 begins to charge the body capacitance of the transistor 210 whenever the voltage 310 is greater than the voltage 314 across the transistor 210. This leads to the illustrated step-like waveform, wherein the voltage 314 bumps up or increases every time that the voltage 310 rises above the transistor voltage 314. This voltage 314 falls to near zero when the transistor 210 turns back on, and similarly the rectified current 312 begins to flow through the first diode 206 and the transistor 210 again.

Little to no voltage 318 is across the first diode 206 when the transistor 210 is on. However, when the transistor 210 turns off, the first diode 206 is forward biased by the voltage 310. The amount of forward bias quickly declines as the body capacitance of the transistor 210 charges and the voltage 314 across the transistor 210 increases. Eventually, the voltage 314 across the transistor 210 is large enough that it reverse biases the first diode 206 thus turning the first diode 206 off and isolating the transistor 210 from the RF voltages 306 and 310. This process of reverse biasing the first diode 206 using just the RF voltage and body capacitance of the transistor 210 is herein referred to as autobiasing the first diode 206.

The plots in FIG. 3 are not illustrated to scale and do not represent preferred frequencies or amplitudes. These are merely exaggerated and simplified renditions of voltage and current characteristics illustrated for the purposes of aiding the reader in understanding the functioning of the circuit elements of FIG. 2 as well as further embodiments discussed later in this disclosure. More realistic plots are illustrated in FIGS. 8-11, although it should be recognized that even these plots are based on Spice models and thus do not perfectly represent actual current and voltage waveforms. Also variations in the circuit elements used in different embodiments (e.g., larger or smaller capacitance) may alter the shape, phasing, and amplitude of the waveforms illustrated in FIGS. 8-11.

Figure 8:
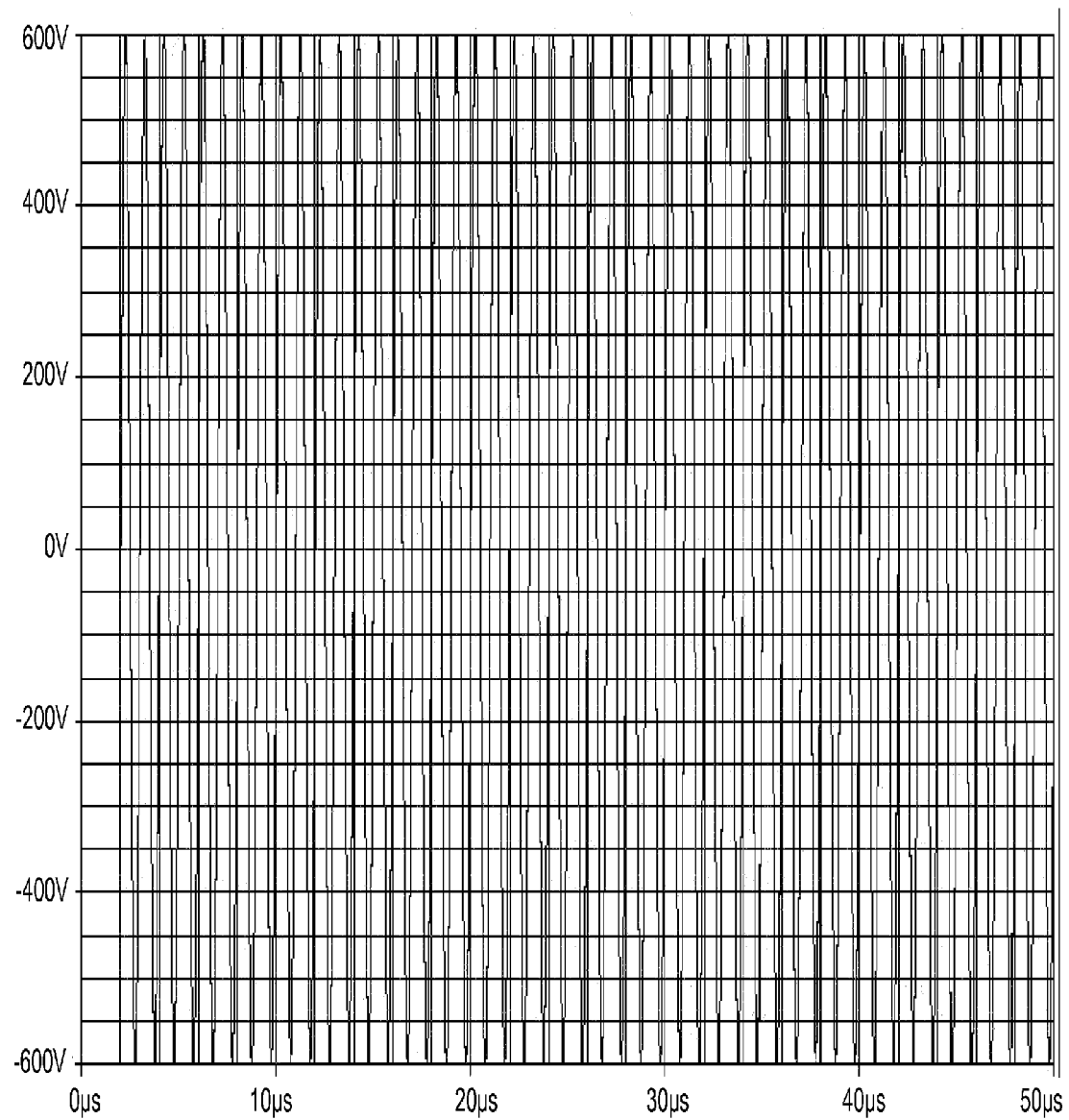
FIG. 8 illustrates an exemplary RF voltage plot.

FIG. 8 illustrates an exemplary RF voltage signal at the node 220. The illustrated RF voltage signal is analogous to the voltage 306 in FIG. 3. This signal represents a simple sinusoidal RF signal as provided by a generator such as generator 102 and as measured on the first voltage line 202.

Figure 9:
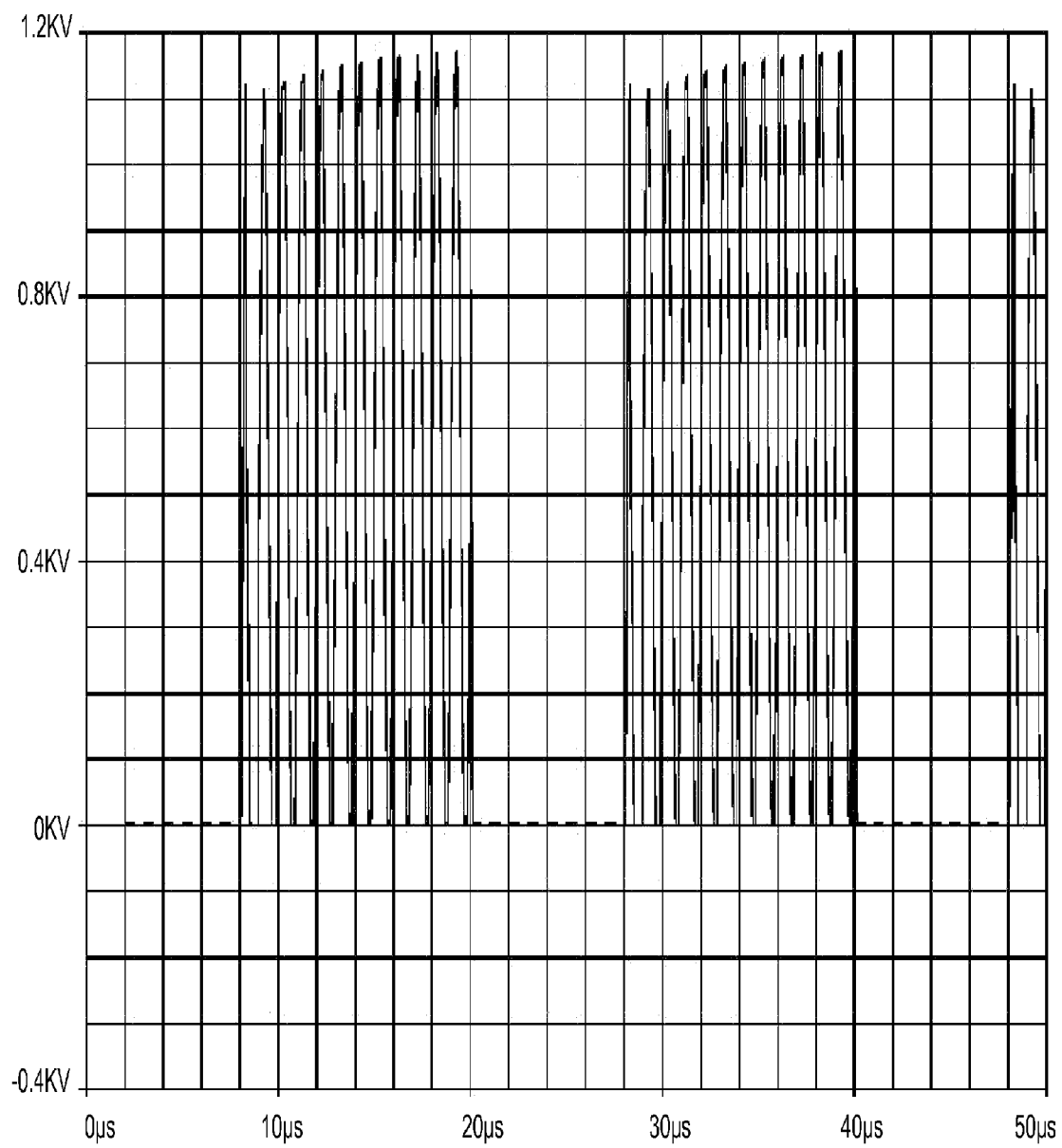
FIG. 9 illustrates another exemplary voltage plot.

FIG. 9 illustrates an exemplary voltage at the first node 222. The illustrated voltage is analogous to the voltage 310 in FIG. 3. Again, the gradual increase in the peak voltage can be seen between 9 μs and 20 μs and between 29 μs and 40 μs as the body capacitance of the transistor 210 is charged. When the transistor 210 is on, the voltage drops to around 0 V.

Figure 10:
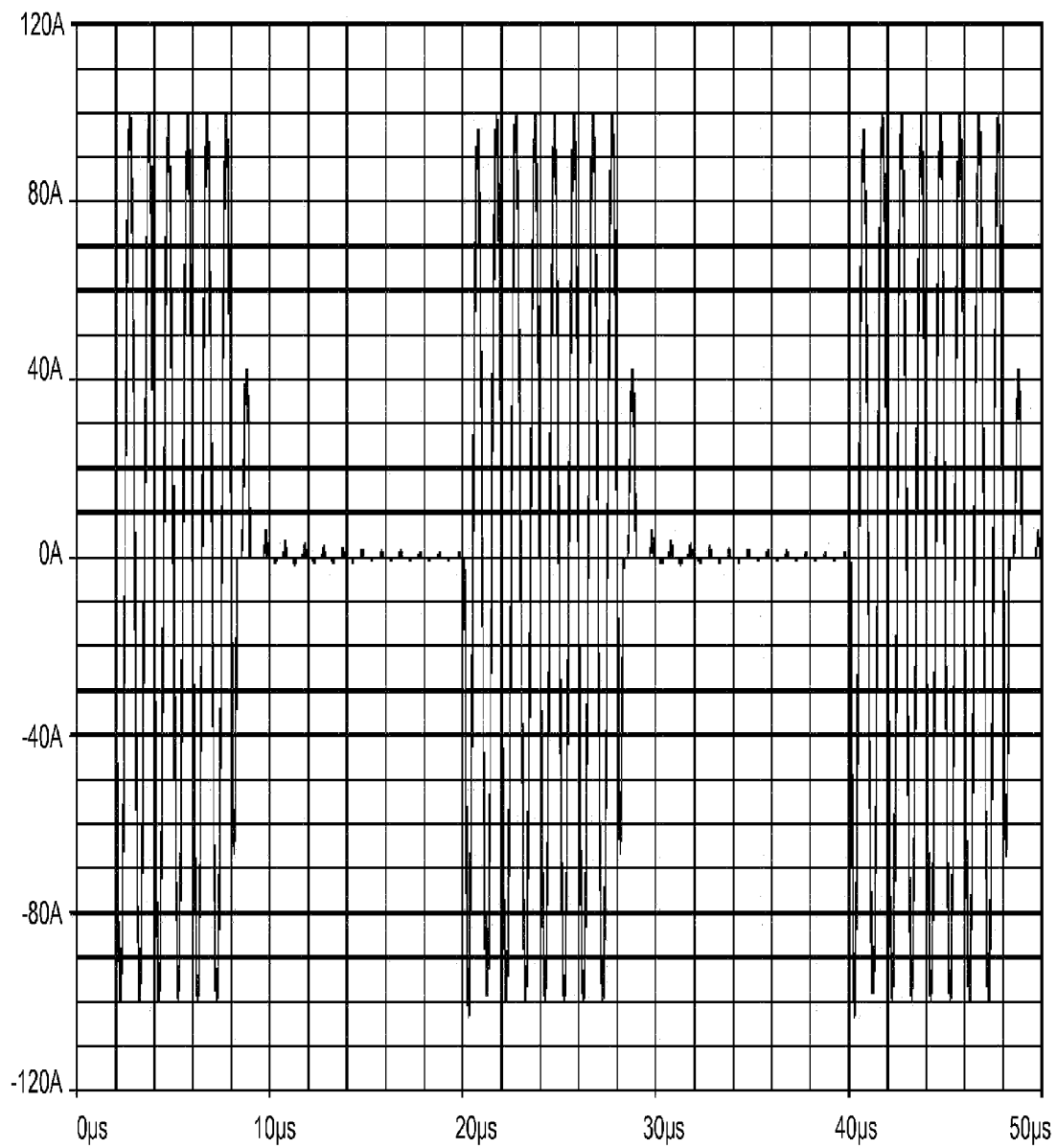
FIG. 10 illustrates yet another exemplary current plot.

FIG. 10 illustrates an exemplary current at the first node 222. The illustrated current is analogous to the current 308 in FIG. 3. When the transistor 210 is on, the current oscillates in similar fashion to the current on the first voltage line 202. When the transistor 210 is off (e.g., between 9 μs and 20 μs, 29 μs and 40 μs, and 39 μs and 50 μs) the current at the first node 222 fluctuates near zero amperes. Here, small current oscillations can still be seen even when the transistor 210 is off. The small positive oscillations represent current that passes through the switched capacitor 208 and the first diode 206 to charge the body capacitance of the transistor 210. As seen, even these small positive oscillations gradually decrease as the body capacitance is charged.

One aspect to note, is that the small positive fluctuations do not die out entirely as would be expected when the body capacitance is charged sufficiently to reverse bias the first diode 206. This is because in practice, the transistor 210 may experience leakage current into the second voltage line 201. This leakage current discharges a small portion of the charge of the body capacitance every cycle, and thus more current is used on each cycle to replace charge lost to leakage current. As will be discussed in the embodiment illustrated in FIG. 5, this effect leads to distortion of the RF signal, which can be problematic for applications where the RF voltage is low (e.g., less than twice a diode voltage drop). In other words, where the distortion is relatively large compared to the RF voltage, distortion is more detrimental than at higher powers such as those illustrated in FIGS. 8-11. An additional bias illustrated in FIG. 5 can be implemented to mitigate this distortion.

Figure 11:
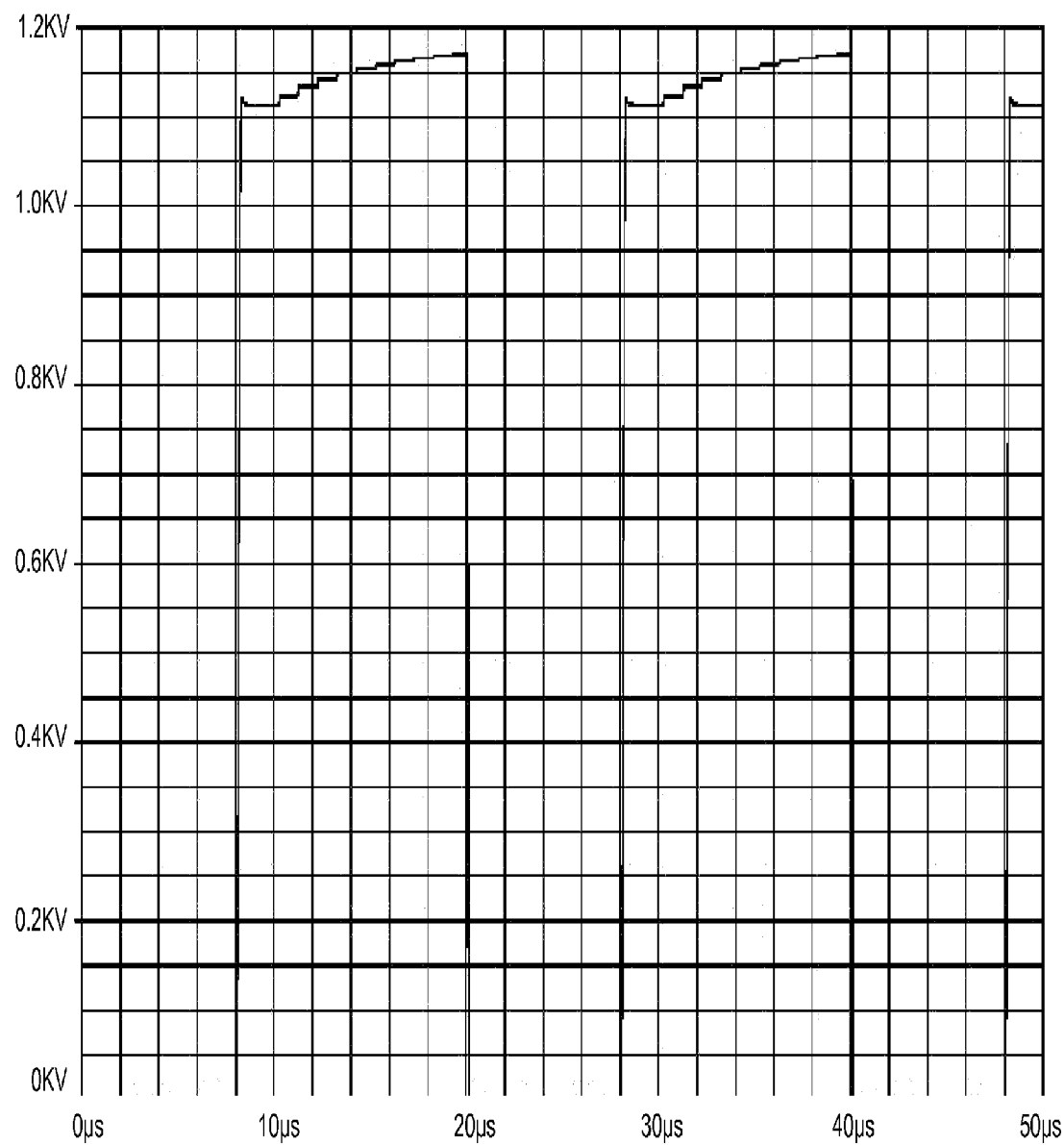
FIG. 11 illustrates still another exemplary voltage plot.

FIG. 11 illustrates an exemplary voltage across the transistor 210. The illustrated current is analogous to the voltage 314 in FIG. 3. Again, little to no voltage is seen across the transistor 210 when it is on, but when the transistor 210 is off, a voltage rapidly builds. A gradual stair-step of increasing voltage can be seen while the transistor 210 is off, corresponding to a buildup of charge and voltage across the body capacitance of the transistor 210. Although not illustrated, at a high enough voltage the first diode 206 is switched off such that further current does not pass to the transistor 210 and thus the body capacitance does not charge further. When the transistor turns back on, the voltage rapidly discharges to or near 0 V.

Figure 4:
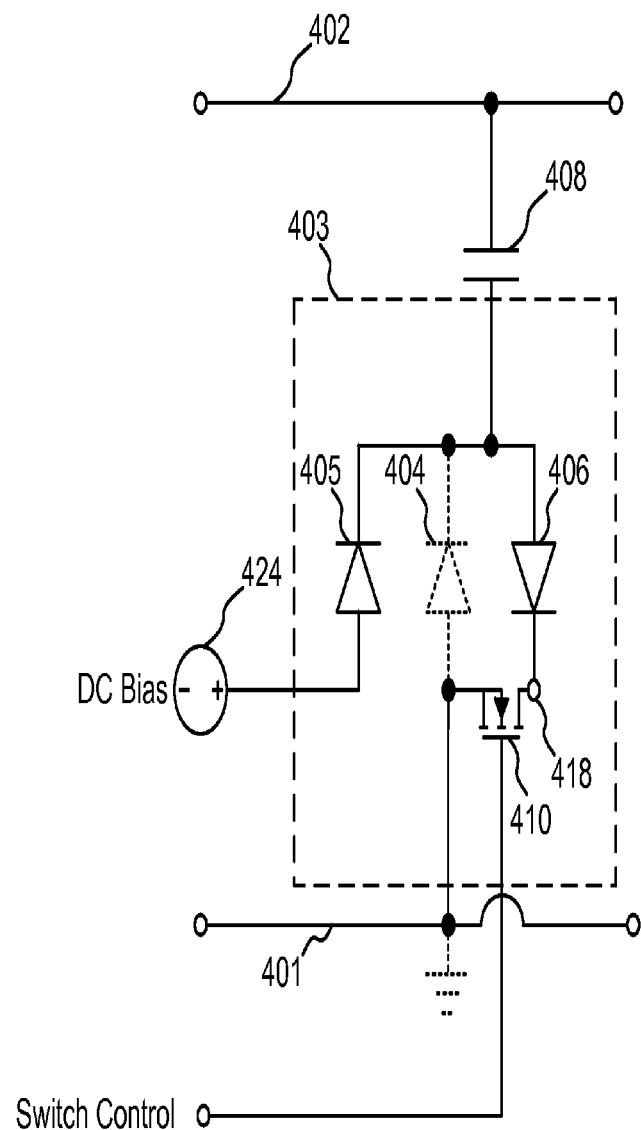
FIG. 4 illustrates another embodiment of a switched capacitor and its respective switching circuit.

FIG. 4 illustrates another embodiment of a switched capacitor 408 and its respective switching circuit 403. Switching circuit 403 is particularly applicable to low power regimes (e.g., where the RF power is ~30 W). Switching circuit 403 is like that of 203, but with the addition of a third diode 405 and a bias 424 (e.g., a small signal current source). A switching circuit lacking the third diode 405 and bias 424 may not see enough voltage in the RF signal to bias the diodes 404, 406 (forward or reverse biased). For instance, where the RF signal voltage is less than twice a diode voltage drop, the voltage may not be sufficient to bias the diodes 404, 406 (turn them on and off). As one example, given diodes with a 0.7 V diode voltage drop, an RF signal below 1.4 V may only partially, or not at all, switch the first and second diodes 404, 406 on and off.

The DC bias 424 can provide sufficient current to ensure that the first diode 406 is forward biased. The third diode 405 can aid in providing sufficient bias to the first diode 406 to enable the first diode to turn on, and can also protect the DC bias 424 from the RF power signal. In one embodiment, the DC bias 424 is a small signal current source producing a constant current.

At low RF signal voltages (e.g., below twice a diode voltage drop) the second diode 404 may not be forward biased during negative portions of the RF signal on the first voltage line 402. DC bias 424 may provide current through the capacitor 408 to the first voltage line 402 during these times. As the voltage of the first voltage line 402 falls sufficiently such that the second diode 404 is forward biased and turns on, current begins to be drawn from both the second voltage line 401 (optionally grounded or a connection to ground) through the second diode 404 as well as from the DC bias 424. As this trend continues, an increasing amount of current is drawn through the second diode 404 and only a limited amount of current is drawn from the DC bias 424. As such, the DC bias 424 need not be a large bias source (e.g., typically less than 4 V or a small signal current source).

While the DC bias 424 and the second diode 405 have been described as helpful when the RF signal voltage is low, it should be understood that these components are useful for both high and low RF voltage regimes. For instance, given a high RF voltage (e.g., greater than twice a diode voltage drop), when the voltage swings and crosses 0 V, there may be insufficient voltage to bias the diodes 404 and 406, and thus for short periods of time surrounding the RF voltage zero crossings, the switching circuit 403 may not operate effectively at switching the switched capacitor 408 in and out of the variable capacitance circuit, which will distort the RF signal. The DC bias 424 helps reduce such distortion by ensuring that the first diode 406 is forward biased even when the RF signal passes near or through 0 V. In embodiments, where high powers are not needed, the second diode 404 can be excluded such that current passing through the switched capacitor 408 to the first voltage line 402 can be provided entirely by the DC bias 424. As seen, the embodiment illustrated in FIG. 4 has benefits for systems operating at low RF voltage as well as systems operating at high RF voltage and systems operating in both regimes.

While discussion of FIG. 4 has focused on a switched capacitor 408, in other embodiments, the match network comprising the switched capacitor 408 can utilize any form of switched reactance elements, such as inductive elements (e.g., inductors) or combinations of inductive and capacitive elements (e.g., a capacitor in series with an inductor) or distributed elements such as transmission line sections, in order to match both real and imaginary portions of impedance.

Figure 5:
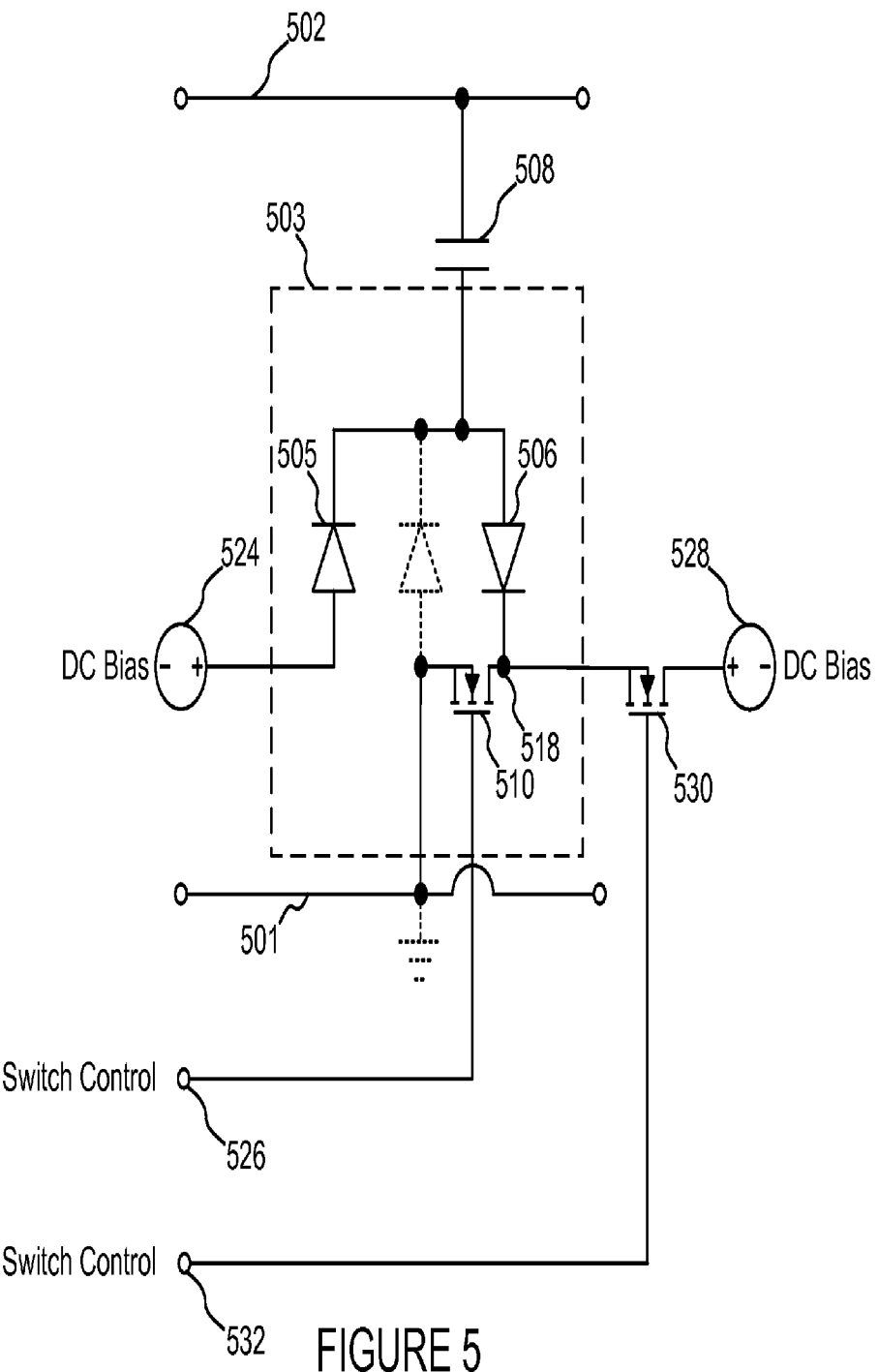
FIG. 5 illustrates yet another embodiment of a switched capacitor and its respective switching circuit.

FIG. 5 illustrates yet another embodiment of a switched capacitor 508 and its respective switching circuit 503. Switching circuit 503 operates similarly to switching circuit 303, but with the addition of a DC bias 528 that is switched in at second node 518 via transistor 530. The DC bias 528 assists in turning the first diode 506 off (thus increasing switching speed) and in replenishing charge on the body capacitance of the transistor 510 that is lost to leakage current.

As before, switching circuit 503 switches switched capacitor 508 in and out of a variable capacitance element via switching of transistor 510. Switching circuit 503 includes diodes 505 and 506 that are parallel but of opposite polarity. DC bias 524 provides current through the third diode 505 in order to forward bias the first diode 506 during low RF voltage periods when the first diode 506 might otherwise not have sufficient voltage to be forward biased. In one embodiment, DC bias 524 is a small signal current source providing a constant current.

Additionally, switching circuit 503 includes a DC bias to terminal 518 of the transistor 510 as provided by DC bias 528. The DC bias 528 operates to provide a voltage bias to the second node 518 when the transistor 510 is open (off), where the DC bias 528 is switched in at the second node 518 whenever switch control 532 directs the transistor 530 to turn on. Thus, the DC bias 528 is switched on when the transistor 510 is switched off and vice versa. Switch control 532 sends signals to a control terminal of the transistor 510 to control the gate (for FETs) or base (for BJTs or IGBTs) of the transistor 530 and switch control 526 controls the same for transistor 510.

Typically, transistor 510 has a body capacitance that is charged by current passing from the first voltage line 502 through the switched capacitor 508 and through the first diode 506. Transistor 510 charges until the voltage from terminal 518 to the second voltage line 501 is sufficiently large so as to reverse bias the diode 506. However, leakage current in the transistor 510 causes the body capacitance to gradually discharge such that the first diode 506 does not remain reverse biased and more current must pass through the first diode 506 to recharge the body capacitance of transistor 510. During times when the body capacitance is being charged, the RF signal is distorted. Such distortion can be neglected at higher RF signal voltages (e.g., greater than twice a diode voltage drop), but at lower voltages (e.g., less than twice a diode voltage drop) such distortion can be problematic.

The DC bias 528 ensures that the body capacitance is continually held at a voltage sufficient to keep the first diode 506 reverse biased despite leakage current of the transistor 510. Thus, DC bias 528 replenishes charge on the body capacitance of the transistor 510 that is lost via leakage current. In this way, DC bias 528 can be used to overcome distortion of the RF signal that otherwise could occur as a result of leakage current in the transistor 510.

Additionally, high speed switching is desirable in order to allow rapid tuning of the match 104. The first diode 506 can slow the switching time if its transient time is large relative to the RF signal frequency. In such instances, the first diode 506 does not turn off as quickly as desired. DC bias 528 mitigates this problem and increases switching speed by applying a reverse voltage bias to the first diode 506 that allows the first diode 506 to turn off more quickly when the transistor 510 is opened (turned off). Thus, DC bias 528 can decrease the switching speed of the switching circuit 503.

It should be noted that although both DC biases 524 and 528 can be on at the same time (e.g., when the transistor 510 is off) and appear to bias the first diode 506 in conflicting manners, they do not counteract each other since the DC bias 524 is a low-voltage current source (current-limited source) while the DC bias 528 is a voltage source (voltage-limited source). DC bias 524 is a low voltage source and thus does not counteract the reverse voltage bias that DC bias 528 applies to the first diode 506.

Like the second voltage line 201, the second voltage line 501 can optionally be grounded or can be replaced by grounding connections for each element illustrated as being coupled to the second voltage line 501.

While discussion of FIG. 5 has focused on a switched capacitor 508, in other embodiments, the match network comprising the switched capacitor 508 can utilize any form of switched reactance elements, such as inductive elements (e.g., inductors) or combinations of inductive and capacitive elements (e.g., a capacitor in series with an inductor) or distributed elements such as transmission line sections, in order to match both real and imaginary portions of impedance.

While the first diode 506 and the third diode 505 have been discussed relative to any variety of diodes (e.g., PN, PIN, or Schottky, to name three), details of an embodiment where at least one PIN diode is used will now be discussed. First diode 506 can be a PIN diode in one embodiment. In such an instance, the PIN diode may only partially rectify the RF signal passing through the capacitor 508, and therefore RF current charges and discharges the body capacitance in the transistor 510 and thus the body capacitance of the transistor 510 may charge either very slowly, or never to a voltage sufficient to reverse bias the first diode 506. In one embodiment, an optional DC bias 528 can provide a DC voltage to node 518 that can charge the body capacitance on the transistor 510. Optional transistor 530 can switch the optional DC bias 528 into the circuit as dictated by controls signals from optional switch control 532.

In other embodiments, the third diode 505 can be either a rectifying diode for RF, such as a PN or Schottky diode, or can be a PIN diode (partially rectifying or non-rectifying for RF). When the optional second diode 504 is implemented, DC bias 524 and third diode 505 may be excluded.

For the purposes of this disclosure, PN and Schottky didodes are considered rectifying diodes for RF current. PIN diodes are non-rectifying or partially rectifying for RF current.

Figure 6:
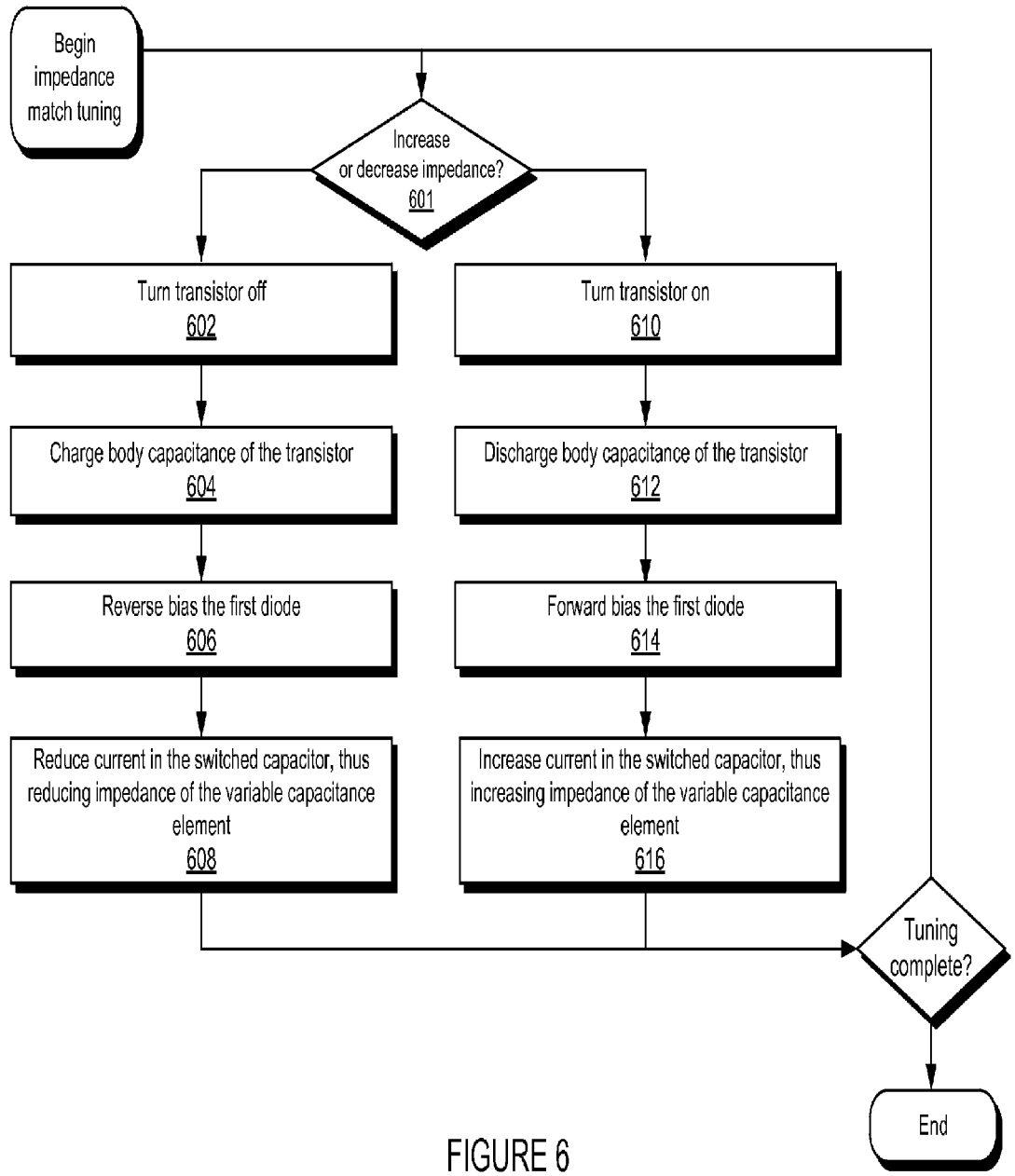
FIG. 6 illustrates a method of tuning an impedance match network.

FIG. 6 illustrates a method of tuning an impedance match network. The method generally involves switching a capacitor in and out of a variable capacitance element of the match network according to one embodiment of this disclosure. For instance, the method includes switching a transistor (e.g., 210, 410, 510) so as to switch a switched capacitor (e.g., 208, 408, 508) in and out of a variable capacitance element (e.g., 200). The method may also involve switching one or more reactive elements in and out of a variable reactance element of the match network according to another embodiment of this disclosure. For instance, the method may be modified to include switching a transistor so as to switch a switched reactance element in and out of a variable reactance element.

The method begins tuning by selecting whether to increase or decrease impedance in decision 601. This decision can be based on measurements of impedance and/or reflectance and a calculation as to whether less power to the plasma load will be reflected via increasing or decreasing impedance. The decision 601 may also be based on whether a real or imaginary component of the impedance is to be altered.

After decision 601 has been made, either of the two illustrated groups of operations can be followed. Where the desired change in impedance indicates that the susceptance of the capacitor bank 200 is to be reduced, the method turns to turn off transistor operation 602. In particular, the turn transistor off operation 602 turns off a transistor of the variable capacitance element. A charging body capacitance of the transistor operation 604 then charges the body capacitance of the transistor via a first diode (e.g., 206, 406, 506) using current from an RF signal being matched by the impedance matching network (e.g., 104). The method further includes reverse biasing the first diode in a reverse bias operation 606. Such reverse bias is brought about via a voltage supplied by the body capacitance of the transistor after charging. In other words, when the transistor body capacitance is sufficiently charged, the diode is reverse biased, thus precluding further current from passing through the diode. This in turn reduces or stops the current from the RF signal passing through the capacitor in a reduce current operation 608. In turn, this reduces a susceptance of the variable capacitance element. Alternatively, current through a switched reactance element can be reduced thus altering an impedance of the variable reactance element.

The method then determines whether tuning is complete. If so, then tuning ends, but if not, the method returns to decision 601 and again decides whether to increase impedance or further decrease it.

The operations for increasing capacitor bank susceptance will now be discussed. A turn transistor on operation 610 turns the transistor of the variable capacitance element on. In turn, a discharge the body capacitance operation 612 discharges the body capacitance of the transistor. Also, the first diode is forward biased with current from the RF signal passing through the capacitor in a forward bias diode operation 614. Finally, an increase current through the capacitor operation 616 increases the current from the RF signal that passes through the switched capacitor. This increases the susceptance of the variable capacitance element. Alternatively, current through a switched reactance element can be increased thus altering an impedance of the variable reactance element.

Either or both sets of operations can be carried out in a looping fashion until the method determines that tuning is complete (when the impedance presented to the generator 102 is sufficiently matched). Further, the method can operate on one or more switching circuits and switched capacitors in a variable capacitance element in a looping fashion. Alternatively, the method can operate on one or more switching circuits and switched reactance elements in a variable reactance element in a looping fashion.

Figure 7:
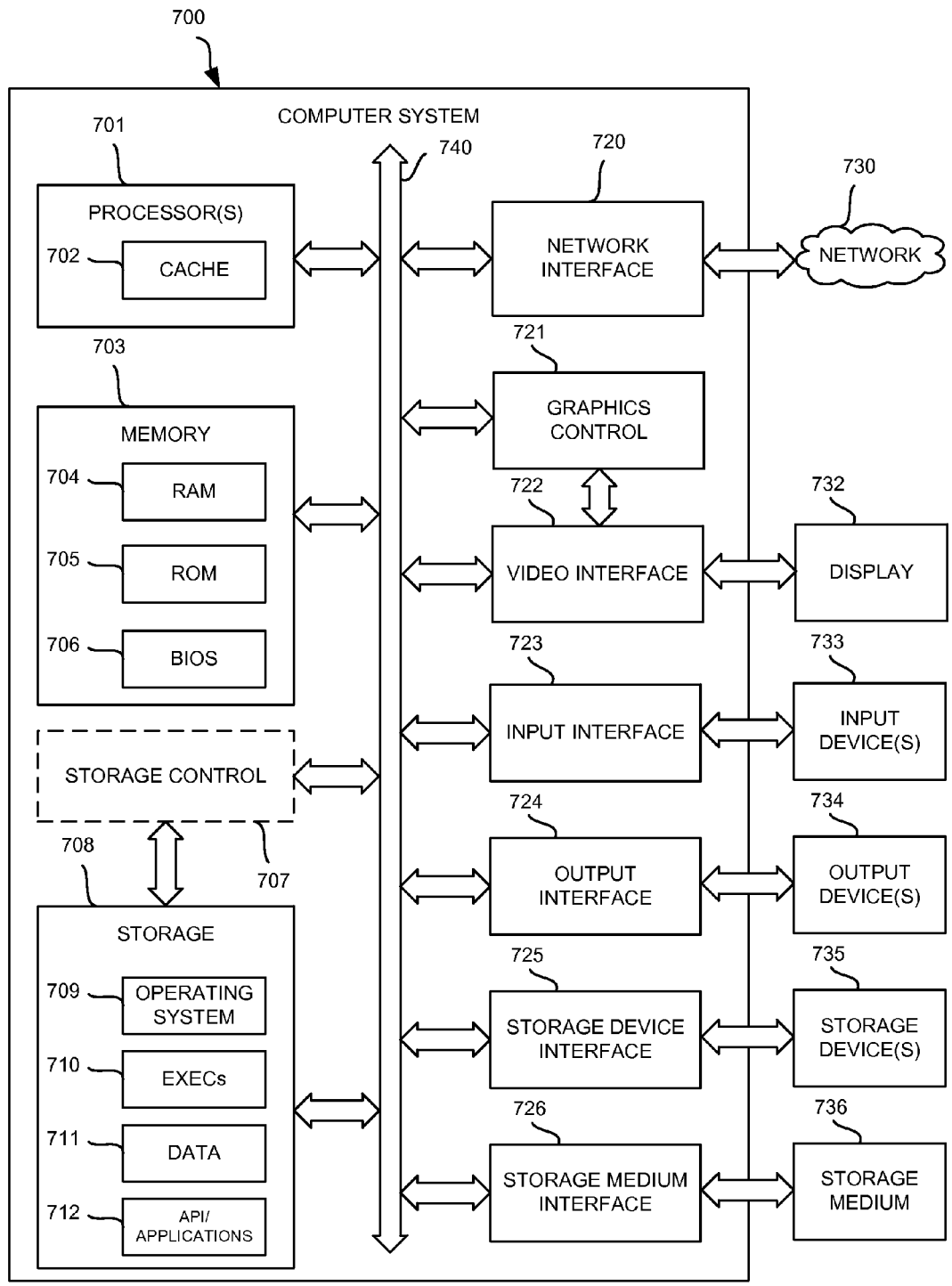
FIG. 7 shows a diagrammatic representation of one embodiment of a machine in the exemplary form of a computer system.

The systems and methods described herein can be implemented in a machine such as a computer system in addition to the specific physical devices described herein. FIG. 7 shows a diagrammatic representation of one embodiment of a machine in the exemplary form of a computer system 700 within which a set of instructions can execute for causing a device to perform or execute any one or more of the aspects and/or methodologies of the present disclosure. The components in FIG. 7 are examples only and do not limit the scope of use or functionality of any hardware, software, embedded logic component, or a combination of two or more such components implementing particular embodiments.

Computer system 700 may include a processor 701, a memory 703, and a storage 708 that communicate with each other, and with other components, via a bus 740. The bus 740 may also link a display 732, one or more input devices 733 (which may, for example, include a keypad, a keyboard, a mouse, a stylus, etc.), one or more output devices 734, one or more storage devices 735, and various tangible storage media 736. All of these elements may interface directly or via one or more interfaces or adaptors to the bus 740. For instance, the various tangible storage media 736 can interface with the bus 740 via storage medium interface 726. Computer system 700 may have any suitable physical form, including but not limited to one or more integrated circuits (ICs), printed circuit boards (PCBs), mobile handheld devices (such as mobile telephones or PDAs), laptop or notebook computers, distributed computer systems, computing grids, or servers.

Processor(s) 701 (or central processing unit(s) (CPU(s))) optionally contains a cache memory unit 702 for temporary local storage of instructions, data, or computer addresses. Processor(s) 701 are configured to assist in execution of computer readable instructions. Computer system 700 may provide functionality as a result of the processor(s) 701 executing software embodied in one or more tangible computer-readable storage media, such as memory 703, storage 708, storage devices 735, and/or storage medium 736. The computer-readable media may store software that implements particular embodiments, and processor(s) 701 may execute the software. Memory 703 may read the software from one or more other computer-readable media (such as mass storage device(s) 735, 736) or from one or more other sources through a suitable interface, such as network interface 720. The software may cause processor(s) 701 to carry out one or more processes or one or more steps of one or more processes described or illustrated herein. Carrying out such processes or steps may include defining data structures stored in memory 703 and modifying the data structures as directed by the software.

The memory 703 may include various components (e.g., machine readable media) including, but not limited to, a random access memory component (e.g., RAM 704) (e.g., a static RAM "SRAM", a dynamic RAM "DRAM", etc.), a read-only component (e.g., ROM 705), and any combinations thereof. ROM 705 may act to communicate data and instructions unidirectionally to processor(s) 701, and RAM 704 may act to communicate data and instructions bidirectionally with processor(s) 701. ROM 705 and RAM 704 may include any suitable tangible computer-readable media described below. In one example, a basic input/output system 706 (BIOS), including basic routines that help to transfer information between elements within computer system 700, such as during start-up, may be stored in the memory 703.

Fixed storage 708 is connected bidirectionally to processor(s) 701, optionally through storage control unit 707. Fixed storage 708 provides additional data storage capacity and may also include any suitable tangible computer-readable media described herein. Storage 708 may be used to store operating system 709, EXECs 710 (executables), data 711, APV applications 712 (application programs), and the like. Often, although not always, storage 708 is a secondary storage medium (such as a hard disk) that is slower than primary storage (e.g., memory 703). Storage 708 can also include an optical disk drive, a solid-state memory device (e.g., flash-based systems), or a combination of any of the above. Information in storage 708 may, in appropriate cases, be incorporated as virtual memory in memory 703.

In one example, storage device(s) 735 may be removably interfaced with computer system 700 (e.g., via an external port connector (not shown)) via a storage device interface 725. Particularly, storage device(s) 735 and an associated machine-readable medium may provide nonvolatile and/or volatile storage of machine-readable instructions, data structures, program modules, and/or other data for the computer system 700. In one example, software may reside, completely or partially, within a machine-readable medium on storage device(s) 735. In another example, software may reside, completely or partially, within processor(s) 701.

Bus 740 connects a wide variety of subsystems. Herein, reference to a bus may encompass one or more digital signal lines serving a common function, where appropriate. Bus 740 may be any of several types of bus structures including, but not limited to, a memory bus, a memory controller, a peripheral bus, a local bus, and any combinations thereof, using any of a variety of bus architectures. As an example and not by way of limitation, such architectures include an Industry Standard Architecture (ISA) bus, an Enhanced ISA (EISA) bus, a Micro Channel Architecture (MCA) bus, a Video Electronics Standards Association local bus (VLB), a Peripheral Component Interconnect (PCI) bus, a PCI-Express (PCI-X) bus, an Accelerated Graphics Port (AGP) bus, HyperTransport (HTX) bus, serial advanced technology attachment (SATA) bus, and any combinations thereof.

Computer system 700 may also include an input device 733. In one example, a user of computer system 700 may enter commands and/or other information into computer system 700 via input device(s) 733. Examples of an input device(s) 733 include, but are not limited to, an alpha-numeric input device (e.g., a keyboard), a pointing device (e.g., a mouse or touchpad), a touchpad, a joystick, a gamepad, an audio input device (e.g., a microphone, a voice response system, etc.), an optical scanner, a video or still image capture device (e.g., a camera), and any combinations thereof. Input device(s) 733 may be interfaced to bus 740 via any of a variety of input interfaces 723 (e.g., input interface 723) including, but not limited to, serial, parallel, game port, USB, FIREWIRE, THUNDERBOLT, or any combination of the above.

In particular embodiments, when computer system 700 is connected to network 730, computer system 700 may communicate with other devices, specifically mobile devices and enterprise systems, connected to network 730. Communications to and from computer system 700 may be sent through network interface 720. For example, network interface 720 may receive incoming communications (such as requests or responses from other devices) in the form of one or more packets (such as Internet Protocol (IP) packets) from network 730, and computer system 700 may store the incoming communications in memory 703 for processing. Computer system 700 may similarly store outgoing communications (such as requests or responses to other devices) in the form of one or more packets in memory 703 and communicated to network 730 from network interface 720. Processor(s) 701 may access these communication packets stored in memory 703 for processing.

Examples of the network interface 720 include, but are not limited to, a network interface card, a modem, and any combination thereof. Examples of a network 730 or network segment 730 include, but are not limited to, a wide area network (WAN) (e.g., the Internet, an enterprise network), a local area network (LAN) (e.g., a network associated with an office, a building, a campus or other relatively small geographic space), a telephone network, a direct connection between two computing devices, and any combinations thereof. A network, such as network 730, may employ a wired and/or a wireless mode of communication. In general, any network topology may be used.

Information and data can be displayed through a display 732. Examples of a display 732 include, but are not limited to, a liquid crystal display (LCD), an organic liquid crystal display (OLED), a cathode ray tube (CRT), a plasma display, and any combinations thereof. The display 732 can interface to the processor(s) 701, memory 703, and fixed storage 708, as well as other devices, such as input device(s) 733, via the bus 740. The display 732 is linked to the bus 740 via a video interface 722, and transport of data between the display 732 and the bus 740 can be controlled via the graphics control 721.

In addition to a display 732, computer system 700 may include one or more other peripheral output devices 734 including, but not limited to, an audio speaker, a printer, and any combinations thereof. Such peripheral output devices may be connected to the bus 740 via an output interface 724. Examples of an output interface 724 include, but are not limited to, a serial port, a parallel connection, a USB port, a FIREWIRE port, a THUNDERBOLT port, and any combinations thereof.

In addition or as an alternative, computer system 700 may provide functionality as a result of logic hardwired or otherwise embodied in a circuit, which may operate in place of or together with software to execute one or more processes or one or more steps of one or more processes described or illustrated herein. Reference to software in this disclosure may encompass logic, and reference to logic may encompass software. Moreover, reference to a computer-readable medium may encompass a circuit (such as an IC) storing software for execution, a circuit embodying logic for execution, or both, where appropriate. The present disclosure encompasses any suitable combination of hardware, software, or both.

In some embodiments, the match network 104 can be controlled via one or more elements illustrated in FIG. 7. For instance, the controller 212 can be embodied in one or more processors 701 and a switching algorithm for controlling switching of the transistors 210 can be stored in, for instance, memory 703, storage 708, and/or storage medium 736. Data controlling initial parameters of the tuning or other aspects of the tuning algorithm can be input by a user via the input device(s) 733 or the network 730. These are just a few examples of ways in which various aspects of this disclosure can be embodied in the elements illustrated in and described relative to FIG. 7.

In conclusion, the present invention provides, among other things, a method, system, and apparatus for switching to add or remove circuit components in a network. Those skilled in the art can readily recognize that numerous variations and substitutions may be made in the invention, its use, and its configuration to achieve substantially the same results as achieved by the embodiments described herein. Accordingly, there is no intention to limit the invention to the disclosed exemplary forms. Many variations, modifications, and alternative constructions fall within the scope and spirit of the disclosed invention.

What is claimed is:

1. An impedance matching network comprising:
a controller;
a first voltage line;
a second voltage line; and
a plurality of reactance elements, each of the plurality of reactance elements coupled in parallel relative to other ones of the reactance elements, and each of the reactance elements coupled between the first voltage line and a respective one of a plurality of switching circuits; wherein
each of the plurality of switching circuits comprises a first node and a second node; a first diode having an anode coupled to the first node and a cathode coupled to the second node; a second diode having an anode to couple to the second voltage line and a cathode to couple to the first node; and a transistor having a first, second, and control terminals, wherein the first terminal is coupled to the second node, the second terminal is coupled to the second voltage line, and the control terminal is coupled to a controller;
the controller is configured to provide a control signal to the control terminal of each of the plurality of switching circuits to selectively switch the transistor in each respective one of the plurality of switching circuits on and off; and
each of the plurality of reactance elements is switched into the impedance matching network when the transistor in the respective one of the plurality of switching circuits is on and switched out after the transistor in the respective one of the plurality of switching circuits is off.

2. The impedance matching network of claim 1, wherein each of the transistors is a field effect transistor (FET), a bipolar junction transistor (BJT), or an insulated-gate bipolar transistor (IGBT).

3. The impedance matching network of claim 2, wherein the first and second diode in each of the plurality of switching circuits is a PIN diode, a PN diode, or a Schottky diode.

4. The impedance matching network of claim 1, wherein at least one of the plurality of switching circuits further comprises a DC bias supply coupled to the first node, wherein, while the transistor is off, the DC bias supply ensures that the first diode is forward biased while a body capacitance of the transistor is charged.

5. The impedance matching network of claim 4, wherein the at least one of the plurality of switching circuits further comprises a third diode coupled between the first node and the DC bias supply that prevents the RF signal from reaching a source of the DC bias supply.

6. The impedance matching network of claim 4, wherein the DC bias reduces distortion of the RF signal when the RF signal is at voltages equal to or below substantially twice a voltage drop of either of the first or second diodes.

7. The impedance matching network of claim 1, wherein at least one of the plurality of switching circuits further comprises a DC bias supply coupled to the second node, the DC bias supply configured to apply a DC bias while the transistor is off.

8. The impedance matching network of claim 1, wherein a susceptance of the body capacitance of the transistor in at least one of the plurality of switching circuits is at least an order of magnitude larger than a magnitude of the susceptance of the reactance element in the at least one of the plurality of switching circuits.

9. An impedance matching network comprising:
a controller;
a first voltage line;
a second voltage line; and
a plurality of switched-reactance elements, each of the plurality of switched-reactance elements coupled in parallel between the first voltage line and the second voltage line, each of the switched-reactance elements including a reactance element and a switching circuit, the reactance element coupled between the first voltage line and a first node of the switching circuit, the switching circuit including a first diode having an anode coupled to the first node and a cathode coupled to a second node; a second diode having an anode to couple to the second voltage line and a cathode to couple to the first node; and a transistor having a first, second, and control terminals; wherein the first terminal is coupled to the second node;

the second terminal is coupled to the second voltage line; and the control terminal is coupled to a controller; and wherein each of the plurality of reactance elements is switched between the first and second voltage lines when the transistor in the respective one of the plurality of switching circuits is on and switched out from between the first and second voltage lines after the transistor in the respective one of the plurality of switching circuits is off.

10. The impedance matching network of claim 9, wherein each of the transistors is a field effect transistor (FET), a bipolar junction transistor (BJT), or an insulated-gate bipolar transistor (IGBT).

11. The impedance matching network of claim 10, wherein the first and second diode in each of the plurality of switched-reactance elements is a PIN diode, a PN diode, or a Schottky diode.

12. The impedance matching network of claim 9, wherein at least one of the plurality of switched-reactance elements further comprises a DC bias supply coupled to the first node, wherein, while the transistor is off, the DC bias supply ensures that the first diode is forward biased while a body capacitance of the transistor is charged.

13. The impedance matching network of claim 12, wherein the at least one of the plurality of switched-reactance elements further comprises a third diode coupled between the first node and the DC bias supply that prevents the RF signal from reaching a source of the DC bias supply.

14. The impedance matching network of claim 12, wherein the DC bias reduces distortion of the RF signal when the RF signal is at voltages equal to or below substantially twice a voltage drop of either of the first or second diodes.

15. The impedance matching network of claim 9, wherein at least one of the plurality of switched-reactance elements further comprises a DC bias supply coupled to the second node, the DC bias supply configured to apply a DC bias while the transistor is off.

16. The impedance matching network of claim 9, wherein a susceptance of the body capacitance of the transistor in at least one of the plurality of switched-reactance elements is at least an order of magnitude larger than a magnitude of the susceptance of the reactance element in the at least one of the plurality of switched-reactance elements.

* * * * *